(12) United States Patent
Kabune et al.

(10) Patent No.: US 6,417,652 B1
(45) Date of Patent: Jul. 9, 2002

(54) LOAD DRIVE CIRCUIT FOR AN ELECTRIC LOAD

(75) Inventors: Hideki Kabune, Chiryu; Hiroshi Hattori, Handa, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/824,710

(22) Filed: Apr. 4, 2001

(30) Foreign Application Priority Data

Apr. 28, 2000 (JP) ........................................ 2000-130813

(51) Int. Cl.⁷ ................................................ G05F 1/40
(52) U.S. Cl. ........................................ 323/268; 307/147
(58) Field of Search ............................... 323/265, 268, 323/271; 307/147; 257/691, 723

(56) References Cited

U.S. PATENT DOCUMENTS

| | | |
|---|---|---|
| 4,612,561 A | 9/1986 | Kimura et al. |
| 5,777,377 A | 7/1998 | Gilmore |
| 5,956,231 A * | 9/1999 | Yamada et al. ............. 361/728 |
| 6,160,326 A * | 12/2000 | Iversen et al. .............. 307/147 |

FOREIGN PATENT DOCUMENTS

| | | |
|---|---|---|
| EP | EP 0706221 A2 | 4/1996 |
| EP | EP 0987762 A2 | 3/2000 |
| WO | WO 94/05040 | 3/1994 |

* cited by examiner

Primary Examiner—Adolf Deneke Berhane
(74) Attorney, Agent, or Firm—Law Offices of David G. Posz

(57) ABSTRACT

A load drive circuit for an electric load comprises a plurality of switching circuits connected in parallel with each other, a first wiring conductor pattern connecting one sides of the switching circuits to an external power side through a first connecting portion, and a second wiring conductor pattern connecting another sides of the switching circuits to a load side through a second connecting portion. The first connecting portion and the second connecting portion are disposed in the vicinity of one end and the other end of a parallel arrangement of the switching circuits, respectively. Current paths from the first connecting portion to the second connecting portion through the switching circuits, respectively, have substantially same resistances.

4 Claims, 4 Drawing Sheets

LOAD DRIVE CIRCUIT FOR AN ELECTRIC LOAD

CROSS REFERENCE TO RELATED APPLICATION

This application is based on and incorporates herein by reference Japanese patent application No. 2000-130813 filed Apr. 28, 2000.

BACKGROUND OF THE INVENTION

The present invention relates to a load drive circuit used for driving a load such as a motor or a solenoid.

In recent years, semiconductor switching devices are employed for accomplishing electric load control. However, the semiconductor switching device becomes large as the load becomes large, resulting in lessening yield, deterioration in packaging quality and high cost.

It is therefore proposed to drive a plurality of semiconductor switching devices in parallel for driving a load, so that power provided for each semiconductor switching device is lowered. Thus, the semiconductor switching devices can be sized small.

However, since the switching devices are driven with a large current, the resistances of wiring conductors of wiring conductor patterns which are connected to the semiconductor switching devices become more significant as the on-resistances of the semiconductor switching devices are decreased. Particularly in the case of driving the semiconductor switching devices in parallel, power concentrates on one of the semiconductor switching devices due to the difference between the resistances of the wiring conductors which constitute current paths through the respective semiconductor switching devices. Thus, the switching devices tend to overheat.

SUMMARY OF THE INVENTION

The present invention has an object to alleviate the influence of wiring conductor resistances of the wiring conductor patterns connected to semiconductor switching devices.

According to the present invention, a plurality of switching circuits are connected in parallel to drive an electric load jointly. One side of the parallel arrangement of the switching circuits is connected to a power source through a first wiring conductor pattern, and the other side of the parallel arrangement of the switching circuits is connected to the load through a second wiring conductor pattern. The first wiring conductor pattern and the second wiring conductor pattern have a first connecting portion connected to the power source and a second connecting portion connected to the load, respectively. Current paths from the first connecting portion to the second connecting portion through the switching circuits are formed to have the same resistance.

Most preferably, the first connecting portion and the second connecting portion are disposed in the vicinity of one end and the other end of a parallel arrangement of the switching circuits, respectively, so that the current paths have substantially the same path length.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in further detail with reference to various embodiments which are directed to an electronic control unit (ECU) for an anti-lock brake system (ABS) control for vehicles.

Figure 1:
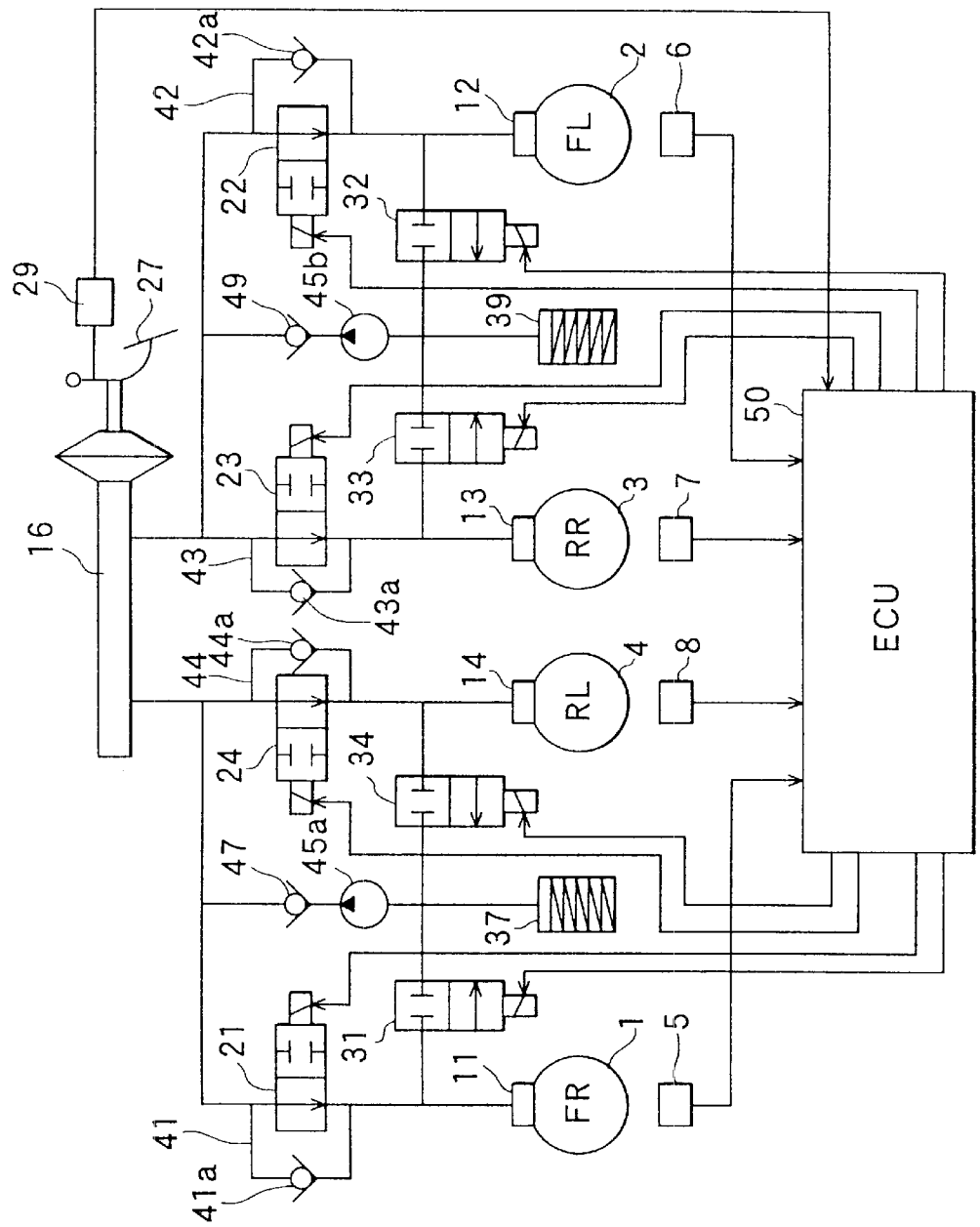
FIG. 1 is a schematic diagram showing an anti-lock braking control system including an electronic control unit for anti-lock braking control.

Referring first to FIG. 1, a front-right (FR) wheel 1, a front-left (FL) wheel 2, a rear-right (RR) wheel 4 and a rear-left (RL) wheel 4 are provided with an electromagnetic pickup type, a magneto-resistive effect device (MRE) type or a Hall device type wheel speed sensors 5 to 8, respectively. These wheel speed sensors 5 to 8 generate respective pulse signals depending on rotation of the wheels 1 to 4.

Moreover, the wheels 1 to 4 are respectively provided with wheel cylinders 11 to 14. When a master cylinder 16 generates a brake fluid pressure depending on the driver's stepping-on amount of a brake pedal 27, this brake fluid pressure is transferred to the wheel cylinders 11 to 14 via dual-position valves (pressure increase control valves) 21 to 24 and through respective fluid pressure piping. The stepping-on condition of the brake pedal 27 is detected by a stop (brake) switch 29.

Moreover, the wheel cylinders 11, 14 are connected with a reservoir 37 via dual-position valves (pressure decrease control valves) 31, 34, respectively. The wheel cylinders 12, 13 are connected with a reservoir 39 via dual-position valves (pressure decrease control valves) 32, 33, respectively.

The dual-position valves 21 to 24 and 31 to 34 are each comprised of a solenoid drive type dual-position valve including a communication position and a shut-off position. These communication position and shut-off position can be switched by feeding electric power to the solenoid.

On the other hand, the upstream and downstream of the dual-position valves 21 to 24 are connected with bypass piping 41 to 44, respectively. These bypass piping 41 to 44 are provided with non-return valves 41a to 44a, respectively. Only the fluid pressure toward the master cylinder 16 from the wheel cylinders 11 to 14 flows through the bypass piping 41 to 44.

The reservoirs 37, 39 are connected with a fluid pressure piping via pumps 45a, 45b driven by a motor not illustrated and non-return valves 47, 49, respectively. Only the fluid pressure toward the master cylinder 16 from the reservoirs 37, 39 is allowed to flow.

Detection signals of the wheel speed sensors 5 to 8 and stop switch 29 are inputted to an ECU 50 for ABS control. The ABS control ECU 50 generates, based on the above detection signals, control signals for the dual-position valves 21 to 24 and 31 to 34 and motor control signals to drive the pumps 45a, 45b. On the basis of these control signals, the dual-position valves 21 to 24 and 31 to 34 and motor are controlled for the purpose of ABS control or the like.

Figure 2:
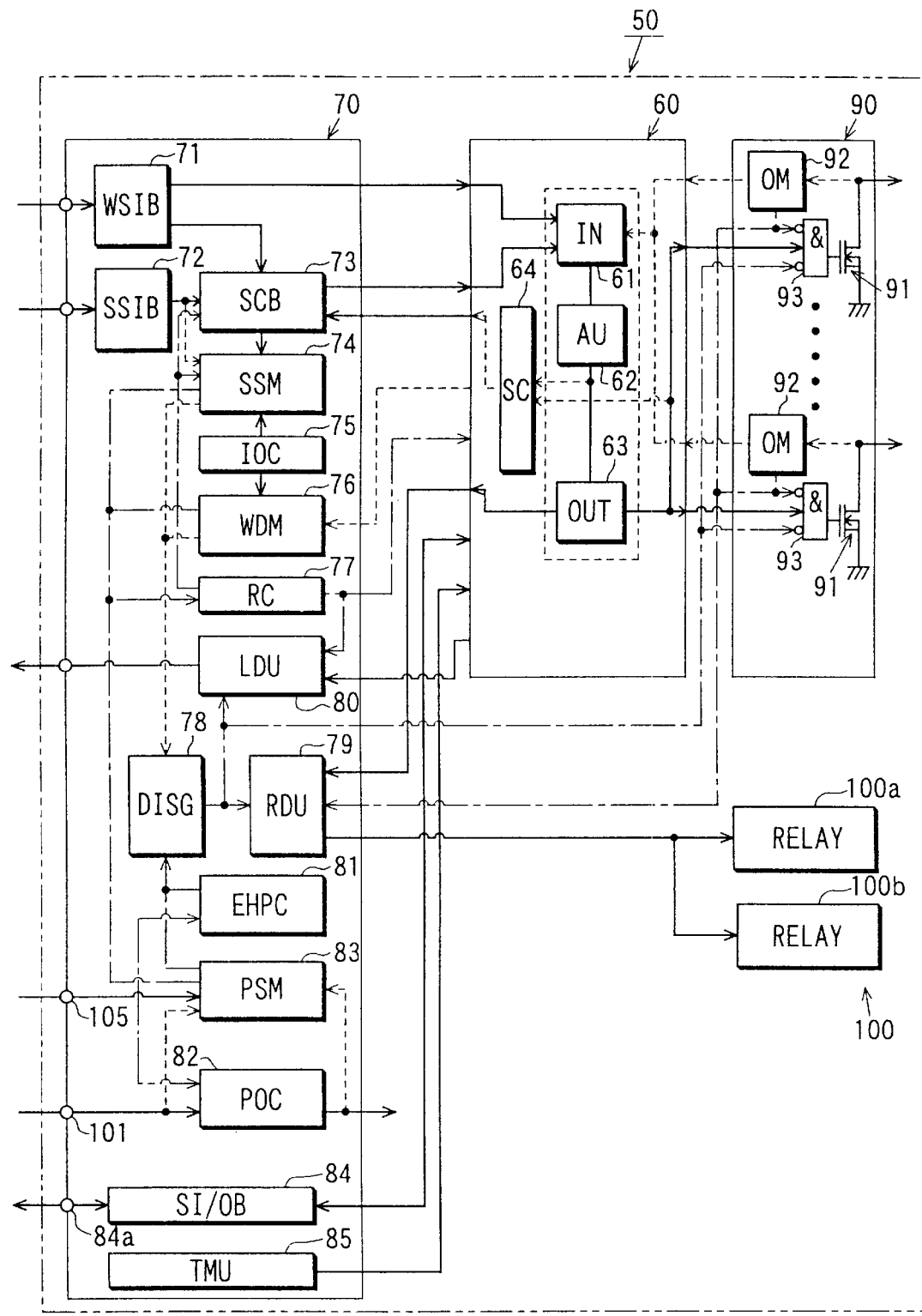
FIG. 2 is a block diagram illustrating the electronic control unit according to an embodiment of the present invention.

As shown in FIG. 2, the ABS control ECU 50 has a plurality of chips including a microcomputer 60, a peripheral IC 70, a solenoid driver 90 and a semiconductor relay 100 or the like. Each arrow mark in a solid line in FIG. 2 indicates a control system line, each arrow mark in a broken line indicates a monitor system line, and each arrow mark in a chain line indicates an inhibit/shut-off system line. The control system line means that a device at the front end of the arrow mark is controlled based on a signal from a device at the rear end of the arrow mark. Moreover, the monitor system line means that a device at the front end of the arrow mark monitors whether a specified device fails or not based on a signal from a device at the rear end of the arrow mark. Moreover, the inhibit/shut-off system line means that a device at the front end of the arrow mark inhibits or shuts off a drive of a specified device based on an inhibit/shut-off signal from a device at the rear end of the arrow mark.

The microcomputer 60 comprises an input unit 61, an arithmetic unit 62, an output unit 63. When various information pieces such as the wheel speed signals are inputted to the input unit 61, the arithmetic unit 62 performs various arithmetic operations used for ABS control based on such various information inputs. The output unit 63 generates ABS control signals, that is, solenoid drive signals andmotor drive signals based on the arithmetic operation. Moreover, the microcomputer 60 is also provided with a serial communication unit 64. When various signals produced in the arithmetic operation of the arithmetic unit 62 (for example, ABS control signal indicating the ABS control condition) are inputted, these various signals are converted to a serial signal and then sent to the peripheral IC 70 as the serial signal.

The peripheral IC 70 comprises a wheel speed input buffer 71, a switch (SW) signal input buffer 72, a serial communication buffer 73, a serial communication monitor unit 74, an internal oscillator circuit 75, a watch-dog (WD) monitor unit 76, a reset control unit 77, a drive inhibit signal generating unit 78, a relay drive unit 79, a lamp drive circuit 80, an excessive-heating protection circuit 81, a power supply output unit 82, a power supply monitor circuit 83, a signal input/output buffer 84 and a temperature monitor unit 85. Each circuit or unit is integrated into one chip to form the peripheral IC 70.

The wheel speed input buffer 71 performs waveform shaping to correct the detection signals transmitted from the wheel speed sensors 5 to 8 of FIG. 1 into a rectangular shape. The wheel speed signal shaped in the waveform by this wheel speed input buffer 71 is then inputted to the microcomputer 60 for various arithmetic operations of wheel speeds and estimated body speed or the like used for ABS control. Moreover, the wheel speed input buffer 71 also detects a breakage of wire connecting the wheel speed sensors 5 to 8 and the ABS control ECU 50. This buffer 71 transmits a wire breakage signal indicating the breakage of wire to the serial communication buffer 73 when the wire breakage is detected.

The SW signal input buffer 72 monitors ON/OFF signal of the stop switch 29 and a signal indicating that the power is fed or not to the solenoids of the dual-position valves 21 to 24, 31 to 34 (for example, a voltage value applied on the solenoid) indicated in FIG. 1. Thereby, the ON/OFF signal indicating whether the brake pedal 27 is stepped on or not and the ON/OFF signal indicating whether the electric power is supplied to the solenoid or not can be outputted.

The serial communication buffer 73 converts a wire breakage signal from the wheel speed input buffer 71 and the ON/OFF signal from the SW signal input buffer 72 to the serial signal, and then transmits the serial signal to the microcomputer 60. The above-described serial signal from the microcomputer 60 is transmitted to this serial communication buffer 73.

The serial signal monitor unit 74 monitors the microcomputer 60 based on the serial signal from the serial communication buffer 73. More specifically, the serial communication buffer 73 receives the result of arithmetic operation from the microcomputer 60 based on the signals from the wheel speed input buffer 71 and SW signal input buffer 72 to monitor whether this signal is normal or not. For example, when the signal indicating the ABS control condition is transmitted from the serial control unit 64 in spite that the OFF signal indicating that the stop switch 29 is not stepped on is transmitted from the SW signal input buffer 72, it is determined that the serial signal from the microcomputer 60 is not normal. When the serial signal from the microcomputer 60 is not normal, a reset signal is outputted to the reset control unit 77 or an inhibit signal is transmitted to the drive inhibit signal generating circuit 78.

The internal oscillator unit 75 forms an internal clock used by the serial signal monitor unit 74 and the WD monitor unit 76 or the like. In this internal oscillator unit 75, a plurality of clock signals are generated at different time points (timings) and the serial signal monitor unit 74 and WD monitor unit 76 select the clock signal of appropriate timing as a monitor signal to realize a monitoring function.

The WD monitor unit 76 monitors whether the arithmetic operation in the microcomputer 60 is performed normally or not based on the data such as arithmetic operation period produced from the microcomputer 60. For example, since the WD monitor signal is produced as a signal that is alternately inverted when the arithmetic operation is performed normally, if the WD monitor signal is not inverted alternately, it indicates that the arithmetic operation of the microcomputer 60 is not executed normally. When the arithmetic operation of the microcomputer 60 is not executed in the normal period, a reset signal is outputted to the reset control unit 77 or the inhibit signal is transmitted to the drive inhibit signal generating circuit 78.

At the time of initialization or when the reset signal is inputted to the reset control unit 77 from the serial signal monitor unit 74, WD monitor unit 76 and power supply monitor unit 83, the reset signal is transmitted to the microcomputer 60. Upon reception of this reset signal, the microcomputer 60 sets the values thereof to a mode of a predetermined reset condition. For example, the microcomputer 60 stops all arithmetic operations. Moreover, this reset signal is also transmitted to the serial communication buffer 73 and serial signal monitor unit 74 for the purpose of initialization based on this reset signal.

The drive inhibit signal generating unit 78 transmits a solenoid drive inhibit signal and a motor drive inhibit signal to the relay drive unit 79 based on the inhibit signals from the serial signal monitor unit 74, the WD monitor unit 76, the excessive-heating protection circuit 81 and power supply monitor unit 83 and also transmits directly the drive inhibit signal to a solenoid drive driver 90 without via the microcomputer 60. Therefore, when the solenoid drive inhibit signal is transmitted from the drive inhibit signal generating unit 78, the drive of solenoids is inhibited even when the microcomputer 60 is in operation.

The relay drive unit 79 controls switching of a semiconductor relay unit 100 and also controls power supply to the motor to drive the solenoids and pumps 45a, 45b based on the solenoid drive signals and motor drive signal from the microcomputer 60. Moreover, when the solenoid drive inhibit signal and motor drive inhibit signal are inputted from the drive inhibit signal generating unit 78 and the output monitor unit 92 of the solenoid driver 90, the relay drive unit 79 stops power supply to the solenoids and to the motor with the semiconductor relay unit 100.

The lamp drive unit 80 outputs under the normal condition the operating condition of the ABS control based on an ABS control condition signal from the microcomputer 60. However, it outputs a non-operating condition of the ABS control when the reset signal from the reset control unit 77 is inputted or when the solenoid drive inhibit signal and the motor drive inhibit signal are inputted from the drive inhibit signal generating unit 78. The lamp not illustrated lights up by receiving the signal from the lamp drive unit 80 to ensure the operating condition of the ABS control.

The excessive-heating protection circuit 81 detects that the chip has reached a predetermined temperature in order to prevent that the chip providing the peripheral circuit 70 reaches an abnormal temperature. When the chip has reached the predetermined temperature, the excessive-heating protection circuit 81 causes the drive inhibit signal generating unit 78 to generate the inhibit signal and stops supply of voltage to the microcomputer 60 in view of preventing further temperature rise.

The power supply output circuit 82 corresponds to a monitored block and is connected to a power supply terminal (first power supply terminal) 101, which is connected to an external power supply allocated at the outside of the ECU 50, and a ground terminal (first ground terminal). The power supply output circuit 82 outputs a predetermined voltage (for example, 5V, 3.3V) based on the voltage applied to the power supply terminal 101. An output voltage of the power supply output circuit 82 is used as a power supply voltage of the microcomputer 60, the peripheral IC 70 and the solenoid driver 90 or the like.

The power supply monitor unit 83 corresponds to a monitor block and is connected to a power supply terminal (second power supply terminal) 105 other than the power supply terminal 101 connected with the power supply output circuit 82 and a ground terminal (second power supply terminal). The power supply monitor unit 83 monitors whether the output voltage of the power supply output circuit 82 is the predetermined value or not and also monitors whether the voltage applied to the power supply output circuit 82 is an excessive voltage or not. For example, when the output voltage of the power supply output circuit 82 is less than the predetermined voltage, a reset signal is transmitted to the reset control unit 77. When it is higher than the predetermined value, an inhibit signal is transmitted to the drive inhibit signal generating unit 78. Moreover, the voltage applied to the power supply output circuit 82 is excessive voltage, the inhibit signal is outputted to the drive inhibit signal generating unit 78 and feeding of voltage to microcomputer 60 is stopped to prevent excessive-heating.

The signal input/output buffer 84 is connected to a terminal 84a for checking for diagnosis when a car has a failure, and a tester is connected to a terminal 84a to make communication with the microcomputer 60. Moreover, the signal input/output buffer 84 may be used as only an output buffer, for example, as a buffer which outputs the signal for indicating a vehicle speed displayed on a vehicle speed meter (for example, a signal corresponding to the estimated vehicle speed calculated from he wheel speed).

The temperature monitor unit 85 always detects temperature of the ECU 50. The temperature monitor unit 85 outputs the signal depending on the temperature of ECU 50 to the microcomputer 60 as a temperature detection signal. Based on this temperature detection signal, the microcomputer 60 performs the arithmetic operation for the ABS control depending on the detected temperature.

The solenoid driver 90 comprises MOS transistors 91 connected to the solenoids, output monitor units 92 for monitoring voltage supply condition to the solenoids (MOS transistors 91) and AND circuits 93 for ON/OFF drive of the MOS transistors 91.

The MOS transistors 91 are connected to the respective solenoids of the various control valves 21 to 24, 31 to 34 illustrated in FIG. 1 to execute switching for voltage supply.

The output monitor units 92 are provided on one-to-one basis to the solenoids to monitor a driver output to each solenoid. For example, it monitors the voltage feeding condition to the solenoid based on the drain voltage and drain current of the MOS transistor 91. Thereby, for example, it is detected whether a drain current is excessive or not and whether a power supply wire to the solenoid is open or not or the current is leaking or not, and moreover whether the MOS transistor 91 is in the excessively high temperature or not. Thereby, if the result not suitable for driving the solenoid is attained, the output monitor unit 92 transmits the solenoid drive inhibit signal and the motor drive inhibit signal to the relay drive unit 79 and also outputs the solenoid drive inhibit signal to the AND circuit 93.

To the AND circuit 93, an output signal of the microcomputer 60, an output signal from the relay drive unit 79, an output signal from the drive inhibit signal generating unit 78 and an output signal from the output monitor unit 92 are inputted. In the case of this embodiment, the output signals from the relay drive unit 79, the drive inhibit signal generating unit 78 and the output monitor unit 92 are normally at low level. However, if any failure occurs, it turns to high level and the output of the AND circuit 93 becomes low, that is, the MOS transistor 91 turns off.

Thus, the solenoid driver 90 not only shuts off the power supply to the solenoid based on the signal from the microcomputer 60 and peripheral IC 70 but also shuts off the power supply to the solenoid based on the signal from the output monitor unit 92 provided within the solenoid driver 90 itself.

In the semiconductor relay unit 100, the power supply to the solenoids is switched by a semiconductor relay 100a, while the power supply to the motor to drive the pumps 45a, 45b is switched by a semiconductor relay 100b. These semiconductor relays 100a, 100b are constructed to be controlled on the basis of the signal from the relay drive unit 79 to normally enable power supply to the solenoids and the motors and to disable the power supply to the solenoids and the motors upon reception of the solenoid drive inhibit signal and the motor drive inhibit signal from the relay drive unit 79.

Since the semiconductor relay 100a for solenoid drive has the same construction as semiconductor relay 100b for motor drive, only the semiconductor relay 100b for motor drive will be explained with reference to FIG. 3.

Figure 3:
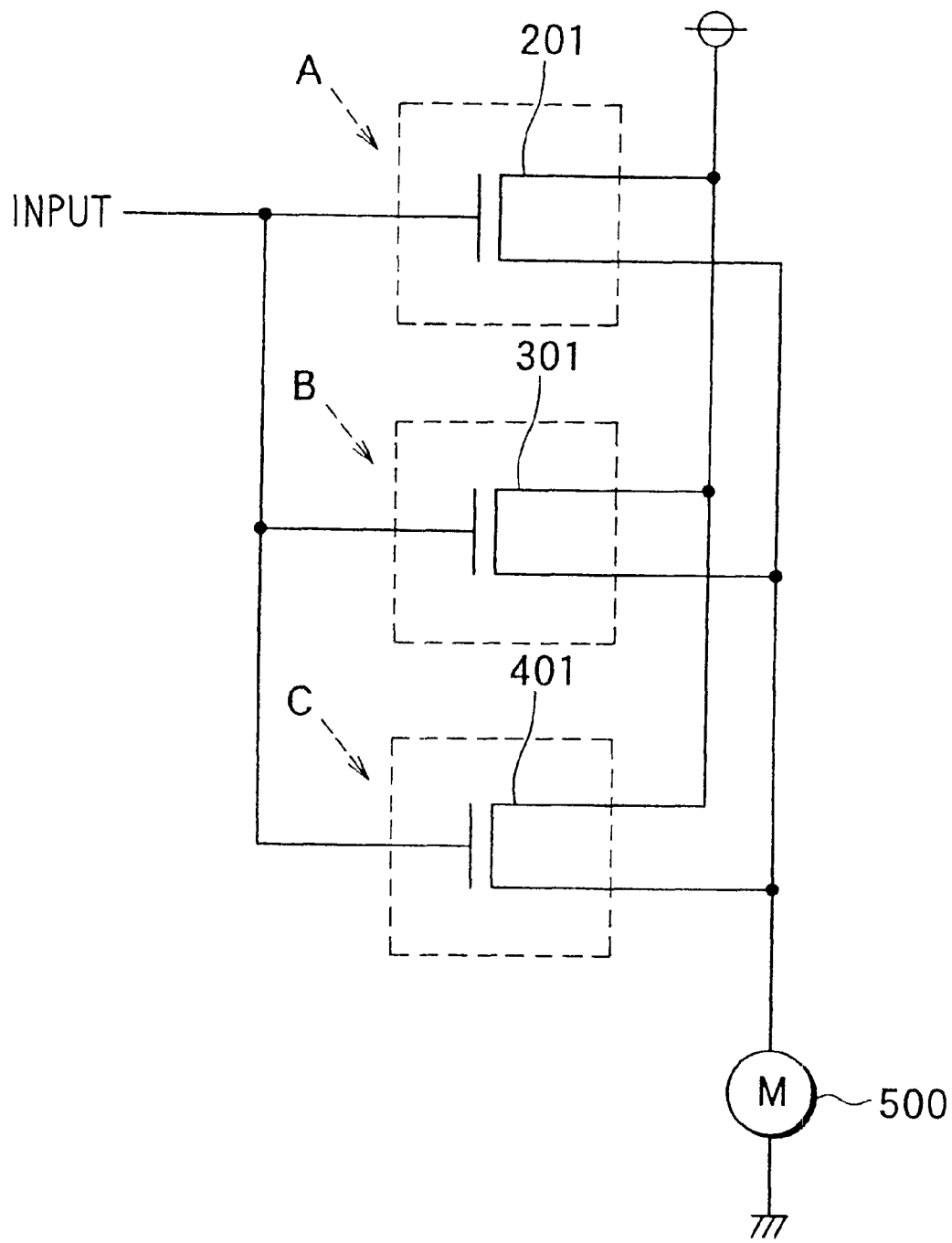
FIG. 3 is a circuit diagram showing a semiconductor relay used in the embodiment.

As shown in FIG. 3, the semiconductor relay 100b has a plurality of intelligent power devices (IPDS) A, B, C as switching circuits that include power MOS transistors 201, 301, 401 as semiconductor switching devices. The IPDs A, B, C have the identical circuit constructions and connected in parallel with each other. The IPDs A, B, C are driven in parallel by using the output from the relay drive unit 79 (FIG. 2) as an input signal to control power supply to the motor 500.

Figure 4:
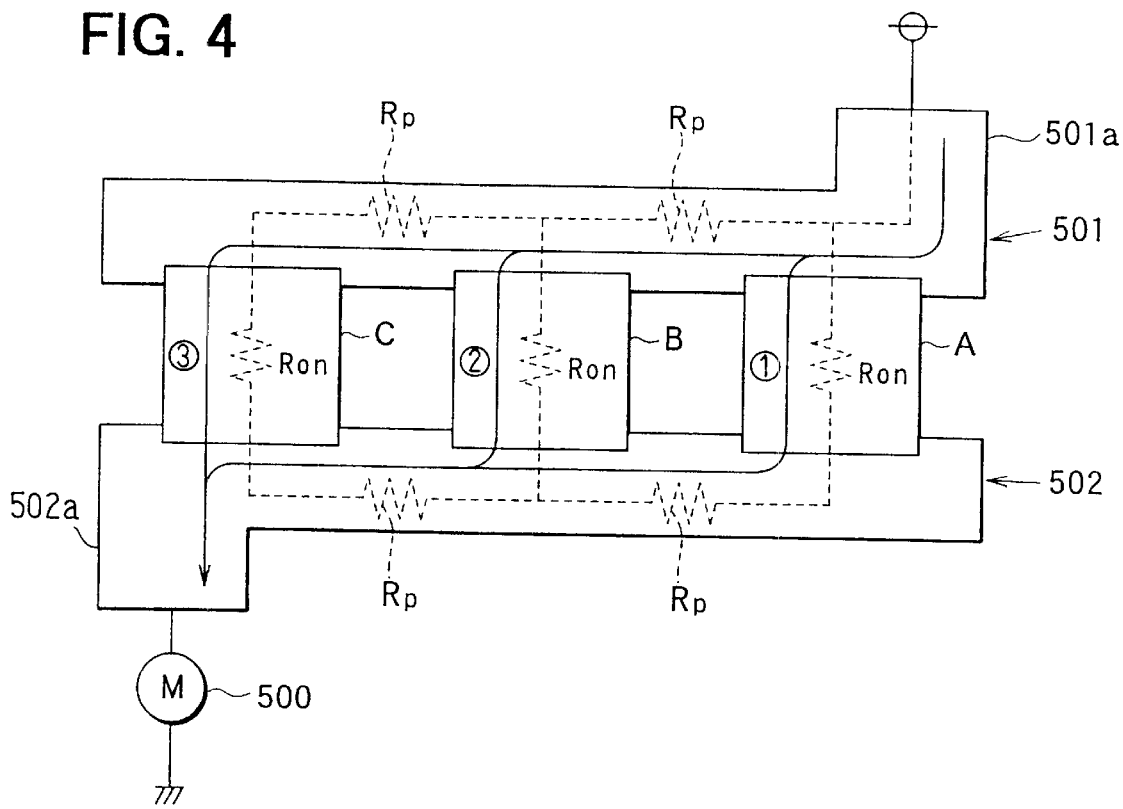
FIG. 4 is a circuit diagram showing an arrangement of intelligent power devices used as the semiconductor relay shown in FIG. 3.

In FIG. 4, a conductive pattern of the semiconductor relay 100b is shown. As shown in this figure, a wiring conductor 501 is provided as an extension to connect the power supply sides of the all IPDs A, B, C, and a wiring conductor pattern 502 is provided as an extension to connect the grounding sides of the all IPDs A, B, C. These wiring conductor patterns are both formed by copper wires which are 1 cm wide, 35 μm thick and 10 cm long, and the resistivity of the copper wires is about $1.7 \times 10^{-8}$ [Ω·m] at 25° C.

The wiring conductor pattern 501 includes a wire connecting portion (a first connecting portion) 501a which is connected to a power source by a wire, and the wiring conductor pattern 502 includes a wire connecting portion (a second connecting portion) 502a which is connected to the motor 500.

The wire connecting portion 501a to which the power source is connected is arranged in the vicinity of one of the IPDs A, B, C which are disposed at the ends (rightmost or leftmost side in the figure) of the arrangement of the IPDs A, B, C. The wire connecting portion 502a connected to the motor 500 is arranged in the vicinity of the other of the IPDs A and C. In the present embodiment, the wire connecting portion 501a to which the power source is connected is formed in the vicinity of the IPD A, and the wire connecting portion 502a connected to the motor 500 is formed in the vicinity of the IPD C.

In the case of this arrangement, a current flows in a current path ① that passes through the IPD A, a current path ② that passes through the IPD B, or a current path ③ that passes through the IPD C. Each current path has a resistance defined by on-resistance Ron of the power MOS transistor 201, 301, 401 and the wiring conductor resistance Rp. That is, the resistance value of each of the current paths ①–③ is Ron+2 Rp.

Therefore the resistance values are not much different among the current paths, so that it is prevented that power concentrates on one of the IPDs A, B, C and causes such an IPD to overheat.

Figure 5:
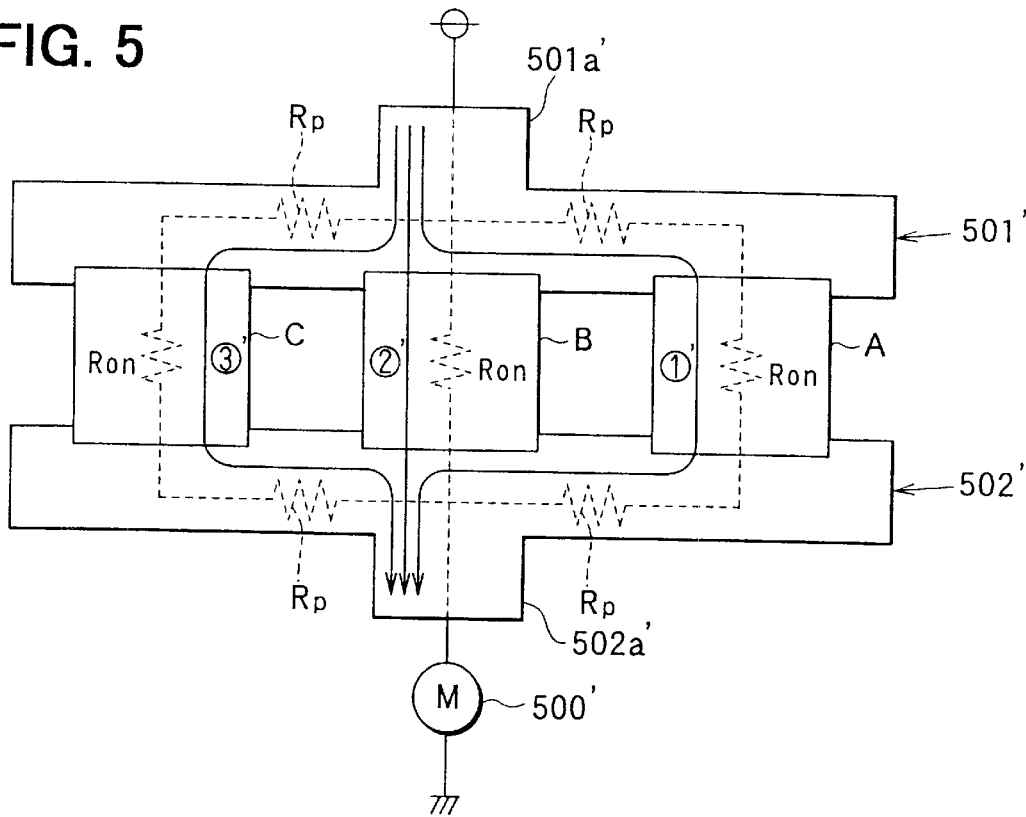
FIG. 5 is a circuit diagram showing another arrangement of power devices used as the semiconductor relay for comparison with the arrangement shown in FIG. 3.

It is assumed here that the IPDs A, B, C, are arranged as shown in FIG. 5. That is, wire connecting portions 501a', 502a', which are provided in a wiring conductor pattern 501' connected to the power supply sides of the IPDs A, B, C and a wiring conductor pattern 502' connected to the grounding sides of the IPDs A, B, C, are disposed in the vicinity of the middle of the arrangement of IPDs A, B, C. One of these wire connecting portions 501a', 502a' is connected to a power source and the other is connected to a motor 500'.

In this case, a current path ②' which passes through the IPD B that is closest to the wire connecting portion 501a', 502a' has the least wiring conductor resistance, because the resistance is formed of only the on-resistance Ron of the IPD B. Other current paths ①' and ③' which pass through the IPDs A and C disposed on either side of the IPD B are in the state where the resistance is formed of not only the on-resistances Ron of the IPDs A and C but also the wiring conductor resistances Rp. That is, the resistance value of the current path ②' is Ron, but the resistance values of the current paths ①' and ③' are Ron+2 Rp. Therefore, in this case shown in FIG. 5, the resistance values are much different among the current paths and hence overheat tends to occur.

As described above, in the above embodiment shown in FIG. 4, the resistances of the current paths ①–③ are equalized and the overheat is minimized while the semiconductor switching devices for driving a load are driven in parallel.

In the above embodiment, two IPDs or four or more IPDs may be used. The similar advantages can be provided by arranging a wire connecting portion to which a power source is connected in the vicinity of one of the IPDs disposed at the ends of the arrangement of the IPDS and arranging a wire connecting portion which is connected to a load in the vicinity of the other of the IPDs disposed at the ends of the arrangement of the IPDs.

What is claimed is:

1. A load drive circuit for an electric load comprising:
   a plurality of switching circuits connected in parallel with each other to drive the load;
   a first wiring conductor pattern having a first width and a first thickness connecting one sides of the switching circuits to an external power side; and
   a second wiring conductor pattern having a second width and a second thickness connecting another sides of the switching circuits to a load side, the first width and the second width being substantially equal, the first thickness and the second thickness further being substantially equal,
   wherein the first wiring conductor pattern has a first connecting portion connected to the external power side and disposed in the vicinity of one end of a parallel arrangement of the switching circuits, and
   wherein the second wiring conductor pattern has a second connecting portion connected to the load side and disposed in the vicinity of another end of the parallel arrangement of the switching circuits.

2. A load drive circuit for an electric load as in claim 1, wherein current paths starting from the first connecting portion and reaching the second connecting portion through the switching circuits, respectively, have substantially same path length.

3. A load drive circuit for an electric load as in claim 1, wherein current paths starting from the first connecting portion and reaching the second connecting portion through the switching circuits, respectively, have substantially same resistances.

4. The load drive circuit as in claim 1, wherein the switching circuits include respective power MOS transistors and constructed as intelligent power devices, respectively.

* * * * *